United States Patent
Hirayama et al.

(10) Patent No.: US 9,895,785 B2
(45) Date of Patent: Feb. 20, 2018

(54) MOTOR DRIVING DEVICE OF MACHINE TOOL COMPRISING PLURALITY OF SWITCHING ELEMENTS

(71) Applicant: FANUC CORPORATION, Yamanashi (JP)

(72) Inventors: Nobuo Hirayama, Yamanashi (JP); Kenichi Okuaki, Yamanashi (JP); Taku Sasaki, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 6 days.

(21) Appl. No.: 15/265,935

(22) Filed: Sep. 15, 2016

(65) Prior Publication Data

US 2017/0080539 A1 Mar. 23, 2017

(30) Foreign Application Priority Data

Sep. 18, 2015 (JP) .................................. 2015-185372

(51) Int. Cl.
*B23Q 5/10* (2006.01)
*B23Q 5/28* (2006.01)
*B23Q 5/32* (2006.01)
*B23Q 11/12* (2006.01)
*H05K 7/20* (2006.01)

(52) U.S. Cl.
CPC .............. *B23Q 11/127* (2013.01); *B23Q 5/10* (2013.01); *B23Q 5/28* (2013.01); *B23Q 5/32* (2013.01); *H05K 7/209* (2013.01)

(58) Field of Classification Search
CPC .......... B23Q 11/127; B23Q 5/10; B23Q 5/28; B23Q 5/32; H05K 7/209

USPC ............................................................ 173/1
See application file for complete search history.

(56) References Cited

FOREIGN PATENT DOCUMENTS

| JP | 89654 A | 1/1996 |
|---|---|---|
| JP | 2001345584 A | 12/2001 |
| JP | 2003243862 A | 8/2003 |
| JP | 200632707 A | 2/2006 |
| JP | 2007281371 A | 10/2007 |
| JP | 2009295626 A | 12/2009 |
| JP | 2014165360 A | 9/2014 |
| JP | 2015103750 A | 6/2015 |

OTHER PUBLICATIONS

English Abstract for Japanese Publication No. 2015-103750 A, published Jun. 4, 2015, 1 pg.
English Abstract for Japanese Publication No. 2009-295626 A, published Dec. 17, 2009, 1 pg.
English Abstract for Japanese Publication No. 2007-281371 A, published Oct. 25, 2007, 1 pg.
English Abstract for Japanese Publication No. 2006-032707 A, published Feb. 2, 2006, 1 pg.
English Abstract for Japanese Publication No. 08-9654 A, published Jan. 12, 1996, 1 pg.

(Continued)

*Primary Examiner* — Michelle Lopez
(74) *Attorney, Agent, or Firm* — Fredrikson & Byron, P.A.

(57) ABSTRACT

A motor driving device comprises a first heat sink arranged outside a housing, a second heat sink arranged inside the housing, and a heat conduction plate configured to thermally connect the first heat sink and the second heat sink. A switching element for a spindle is mounted on the first heat sink, and a switching element for a feed axis is mounted on the second heat sink.

3 Claims, 5 Drawing Sheets

(56) References Cited

OTHER PUBLICATIONS

Untranslated Decision to Grant a Patent mailed by Japan Patent Office (JPO) for Application No. JP 2015-185372, dated Jan. 17, 2017, 3 pages.
English machine translation of Decision to Grant a Patent mailed by JPO for Application No. JP 2015-185372, dated Jan. 17, 2017, 3 pages.
English Abstract and Machine Translation for Japanese Publication No. 2001-345584 A, published Dec. 14, 2001, 11 pgs.
English Abstract and Machine Translation for Japanese Publication No. 2003-324862 A, published Aug. 29, 2003, 6 pgs.
English Abstract and Machine Translation for Japanese Publication No. 2014-165360 A, published Sep. 8, 2014, 10 pgs.

MOTOR DRIVING DEVICE OF MACHINE TOOL COMPRISING PLURALITY OF SWITCHING ELEMENTS

BACKGROUND OF THE INVENTION

1. Field of the Invention

The present invention relates to a motor driving device comprising a plurality of switching elements.

2. Description of the Related Art

A machine tool can process a workpiece while moving the workpiece or a tool. The machine tool comprises a spindle motor for rotating a spindle which holds the workpiece or the tool. Further, the machine tool comprises a feed axis motor for moving the workpiece or the tool in a direction of a predetermined feed axis.

The machine tool comprises a motor driving device for driving these motors. The motor driving device includes a semiconductor element, a capacitor, and the like for controlling an electric current supplied to the motor. The motor driving device is arranged, for example, inside a power magnetics cabinet in which an electromagnetic switch, a relay, a battery, or the like is arranged. As a semiconductor element for supplying and interrupting an electric current to the motor, a switching element is used. The switching element generates heat together with driving and thus is cooled by a heat sink, a fan, and the like.

In Japanese Laid-open Patent Publication No. 2014-165360, a servo amplifier is disclosed in which a heat sink connected to a single heat generation source is extended and connected to a housing. It is disclosed that the heat from the heat generation source is transferred to the housing, and thus the heat generation source is cooled in the servo amplifier.

In Japanese Laid-open Patent Publication No. 2001-345584, an electronic control device is disclosed in which a heat-absorbing heat sink is arranged on an upper side within a housing and a heat-dissipating heat sink is arranged on a lower side within the housing. It is disclosed that, in the electronic control device, the heat-absorbing heat sink and the heat-dissipating heat sink are connected by a heat conductive plate having excellent thermal conductivity.

In Japanese Laid-open Patent Publication No. 2003-243862, an electronic device is disclosed which comprises an internal heat sink to which a heating component is attached and which is arranged inside a housing and an external heat sink arranged outside the housing. The internal heat sink transfers the heat to the external heat sink via a heat conductive rubber sheet. It is disclosed that the heat generated by the heating component is released from the internal heat sink and the external heat sink in the electronic device.

When a plurality of motors are driven by one motor driving device, switching elements of which number corresponds to the number of motors are used. The switching element can be cooled by being mounted on a surface of a heat sink including a plurality of fins. It is preferable that the heat sink for cooling the switching element is arranged outside the housing of the motor driving device from the viewpoint of heat radiation.

However, when the number of feed axes of the machine tool is increased, and the number of the switching element is increased, all of the switching elements may not be mounted on one heat sink in some cases. Further, an area on which the heat sink is arranged is limited, and if many switching elements are cooled by the one heat sink, a cooling capacity per one switching element is lowered.

When all of the switching elements may not be mounted on the one heat sink, a plurality of heat sinks can be arranged. However, due to a restriction on a size of the motor driving device and the like, all of the plurality of heat sinks may not be provided outside the housing of the motor driving device in some cases. In such a case, the heat sinks are arranged inside the housing also.

The heat sink arranged inside the housing is often small due to a condition of a space to be arranged and low in a cooling capacity. In order to increase the cooling capacity of the heat sink arranged inside the housing, it can be considered to increase an air volume of a cooling fan. However, power consumption of the cooling fan is increased. In addition, generally, as the rotation frequency of the fan is increased, the life of the motor will be shorter, and reliability of the cooling fan is decreased. Therefore, when increase in temperature of the switching element becomes larger, output of the switching element needs to be suppressed.

SUMMARY OF INVENTION

A motor driving device of the present invention is a motor driving device for driving a spindle motor and a feed axis motor of a machine tool. The motor driving device comprises a switching element for a spindle configured to drive the spindle motor and a switching element for a feed axis configured to drive the feed axis motor. The motor driving device comprises a housing configured to cover components installed in a substrate. The motor driving device comprises a first heat sink arranged outside the housing, a second heat sink arranged inside the housing, and a heat conduction plate configured to thermally connect the first heat sink and the second heat sink. The switching element for the spindle is mounted on the first heat sink. The switching element for the feed axis is mounted on the second heat sink.

In the above-described invention, one end part of the heat conduction plate can be sandwiched between the first heat sink and the switching element for the spindle. The other end part of the heat conduction plate can be sandwiched between the second heat sink and the switching element for the feed axis.

In the above-described invention, the heat conduction plate can include a bent portion which is bent to avoid components installed in the substrate.

DETAILED DESCRIPTION

With reference to FIG. 1 to FIG. 5, a motor driving device in the embodiment is described. The motor driving device of the present embodiment is a device for driving a motor installed in a machine tool.

Figure 1:
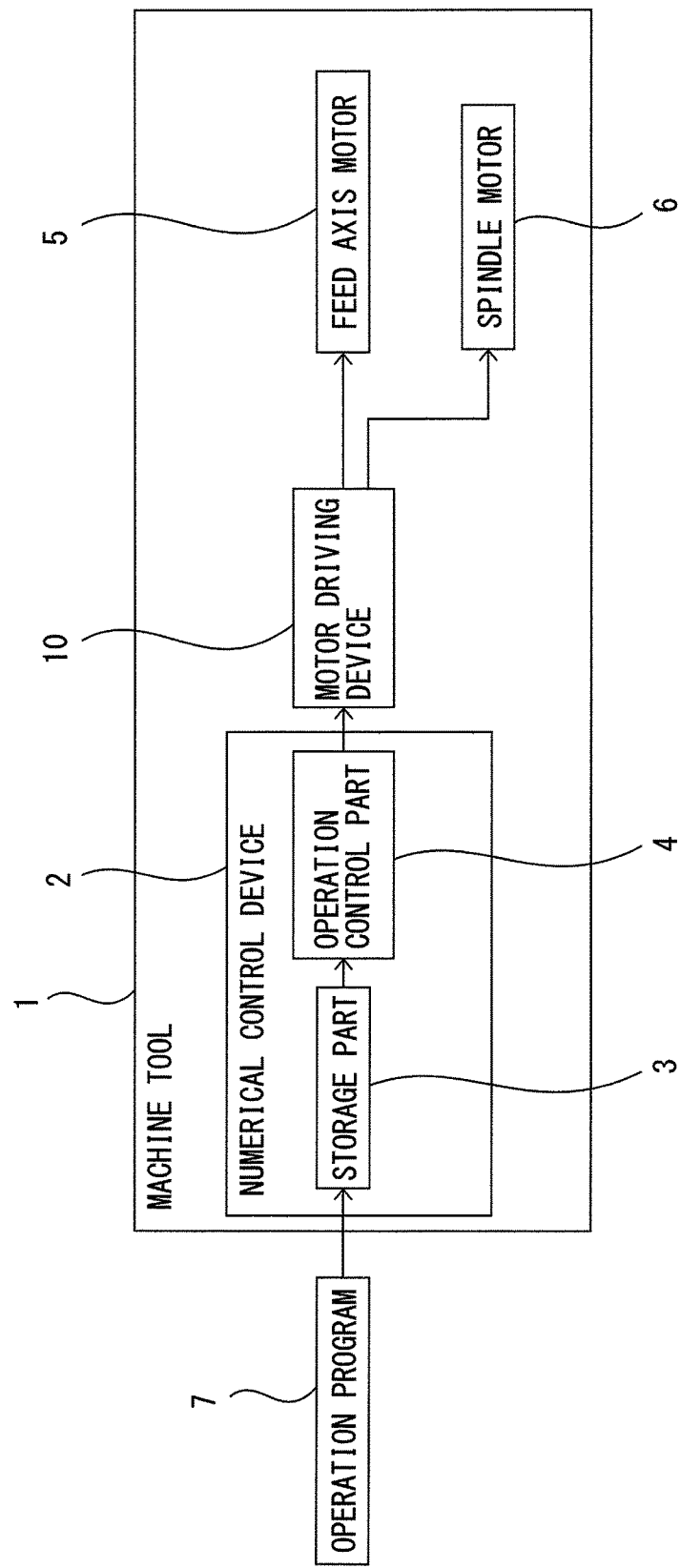
FIG. 1 is a block diagram of a machine tool in an embodiment.

FIG. 1 is a block diagram of the machine tool of the present embodiment. The machine tool 1 includes a feed axis for changing a relative position and an orientation of a tool with respect to a workpiece. The feed axes in the machine tool of the present embodiment are constituted of three linear motion axes (X axis, Y axis, and Z axis). The feed axis of the machine tool 1 is not limited to the present embodiment and can be constituted of an arbitrary linear motion axis and a rotation feed axis.

The machine tool 1 comprises a movement device for moving a workpiece or a tool along the feed axis. The movement device comprises feed axis motors 5 arranged correspondingly to each feed axis. In the present embodiment, the machine tool 1 has three feed axes, and thus three feed axis motors 5 are arranged. Further, the machine tool 1 comprises a spindle motor 6 for rotating a spindle holding a workpiece or a tool. When the spindle motor 6 is driven, the workpiece or the tool is rotated about an axis line of the spindle.

The machine tool 1 comprises a numerical control device 2 for controlling the feed axis motors 5 and the spindle motor 6. The numerical control device 2 is constituted of an arithmetic processing unit including a CPU (Central Processing Unit), a RAM (Random Access Memory), a ROM (Read Only Memory), and the like which are connected to each other via a bus.

An operation program 7 for operating the machine tool 1 is generated in advance by an operator. The numerical control device 2 includes a storage part 3 for storing the operation program 7 and an operation control part 4 for generating an operation command of the motor based on the operation program. The machine tool 1 comprises a motor driving device 10 for supplying electric currents to the feed axis motors 5 and the spindle motor 6 based on an operation command generated by the numerical control device 2.

Figure 2:
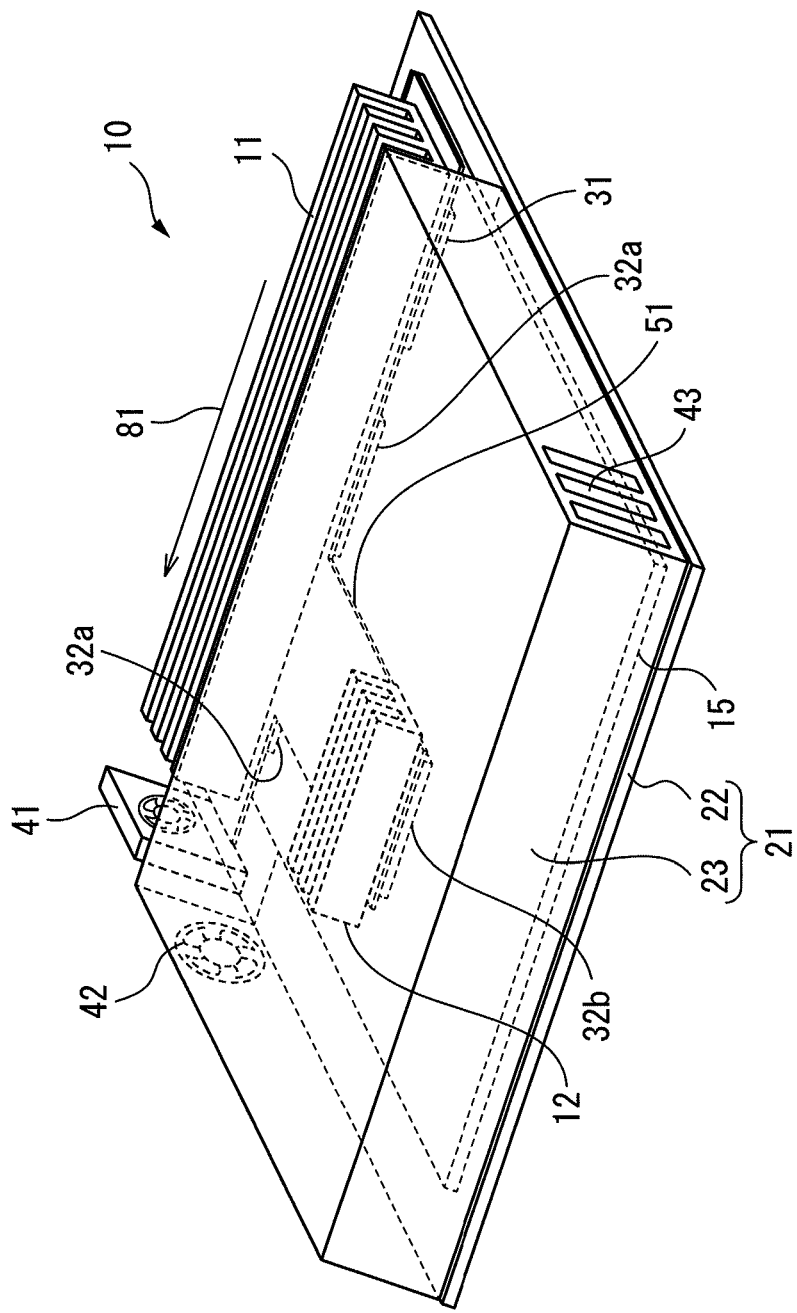
FIG. 2 is a schematic perspective view of a motor driving device in the embodiment.
Figure 3:
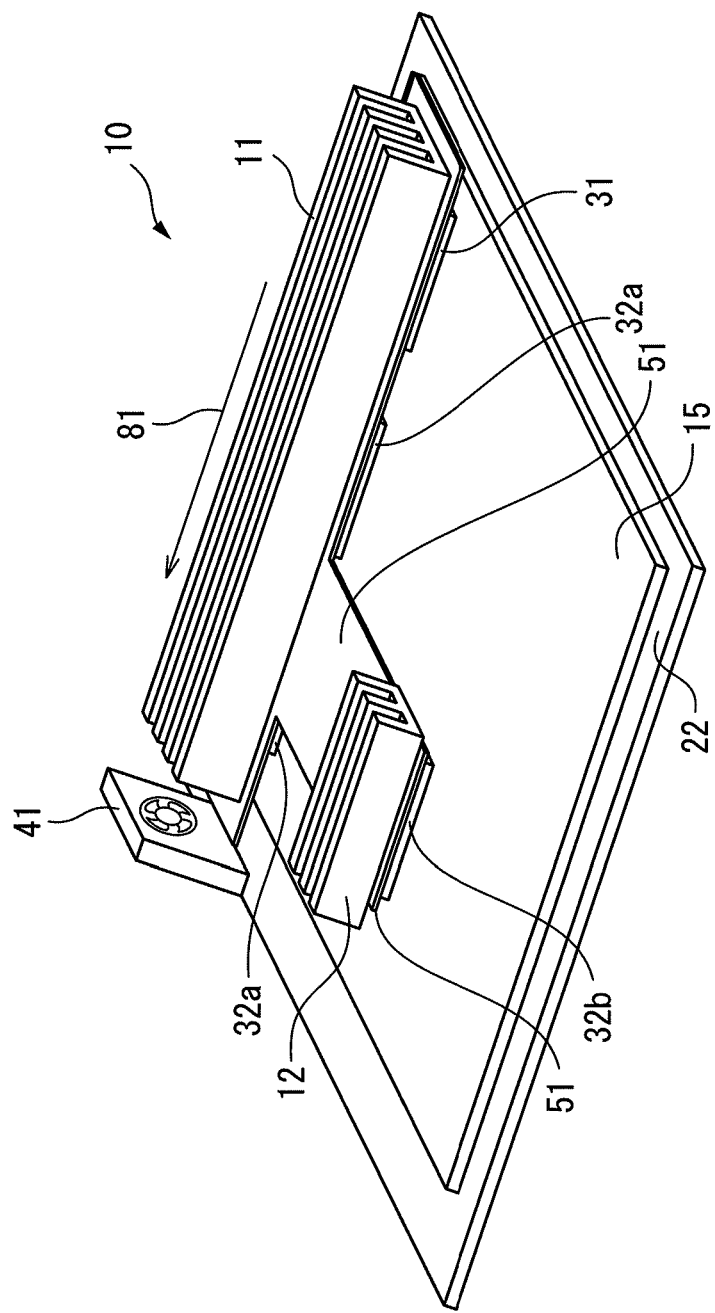
FIG. 3 is a schematic perspective view of the motor driving device in the embodiment when a lid portion is removed.

FIG. 2 shows a perspective view of the motor driving device in the present embodiment. FIG. 3 shows a perspective view of the motor driving device when a lid portion of a housing is removed. With reference to FIG. 2 and FIG. 3, the motor driving device 10 comprises a printed circuit board 15 as a substrate. Various electrical components are installed on a surface of the printed circuit board 15. The motor driving device 10 comprises a housing 21 for covering the electrical components. The housing 21 of the present embodiment includes a bottom plate portion 22 and a lid portion 23.

The lid portion 23 is formed to be removable from the bottom plate portion 22. The printed circuit board 15 is fixed to the bottom plate portion 22.

The motor driving device 10 of the present embodiment comprises a plurality of switching elements 31, 32a, and 32b. The switching elements 31, 32a, and 32b of the present embodiment are power semiconductor elements formed by semiconductors. The switching elements 31, 32a, and 32b adjust electric currents supplied to respective motors. The switching elements of the present embodiment are IGBT (Insulated Gate Bipolar Transistor). The switching elements are not limited to the above configuration and can be exemplified by a transistor, such as a MOS-FET (Metal Oxide Semiconductor Field Effect Transistor) and a GTO thyristor (Gate Turn Off thyristor).

The motor driving device 10 comprises the switching element 31 for the spindle for driving the spindle motor 6 and the switching elements 32a and 32b for the feed axes for driving the feed axis motors 5. In the motor driving device 10, the switching elements 32a and 32b for the feed axes of which the number corresponds to the number of the feed axes are arranged. In the machine tool 1 of the present embodiment, three switching elements 32a and 32b are arranged to drive three feed axis motors 5. The switching element 31 for the spindle and the switching elements 32a and 32b for the feed axes are arranged on the surface of the printed circuit board 15.

The motor driving device 10 in the present embodiment comprises a first heat sink 11 and a second heat sink 12 for cooling the switching elements 31, 32a, and 32b. Each heat sink includes a plurality of fins extending in a predetermined direction.

The switching element 31 for the spindle and two switching elements 32a for feed axes are mounted on the first heat sink 11. The switching element 31 for the spindle and two switching elements 32a for the feed axes are arranged so as to be aligned in a predetermined direction at an end part of the printed circuit board 15. The first heat sink 11 has a longitudinal direction and is arranged so that the longitudinal direction is parallel with a direction in which the switching elements 31 and 32a are aligned. Further, the first heat sink 11 is arranged to cover the three switching elements 31 and 32a.

One switching element 32b for the feed axis is mounted on the second heat sink 12. The one switching element 32b for the feed axis is arranged distant from other two switching elements 32a for the feed axes. The second heat sink 12 is arranged at a position distant from the first heat sink 11.

The first heat sink 11 and the switching element 31 for the spindle and two switching elements 32a for the feed axes arranged on the first heat sink 11 in the present embodiment are arranged outside the housing 21. In the present embodiment, there is no sufficient space on the outside of the housing 21, and thus the switching element 32b for the feed axis is also arranged inside the housing 21. The second heat sink 12 and the switching element 32b for the feed axis arranged on the second heat sink 12 are arranged inside the housing 21.

The motor driving device 10 comprises a heat conduction plate 51 for thermally connecting the first heat sink 11 and the second heat sink 12. The heat conduction plate 51 in the present embodiment is formed of a metal plate. It is preferable that the heat conduction plate 51 is formed of a material having high thermal conductivity, such as aluminum and copper. One end part of the heat conduction plate 51 is connected to the first heat sink 11. In the present embodiment, the one end part of the heat conduction plate 51 is sandwiched between the first heat sink 11 and the switching elements 31 and 32a. Further, the other end part of the heat conduction plate 51 is connected to the second heat sink 12. In the present embodiment, the other end part of the heat conduction plate 51 is sandwiched between the second heat sink 12 and the switching element 32b.

The switching elements 31 and 32a release the heat to the first heat sink 11 via the heat conduction plate 51. The switching element 32b releases the heat to the second heat sink 12 via the heat conduction plate 51. Further, the heat of the second heat sink 12 is transferred to the first heat sink 11 via the heat conduction plate 51.

Figure 4:
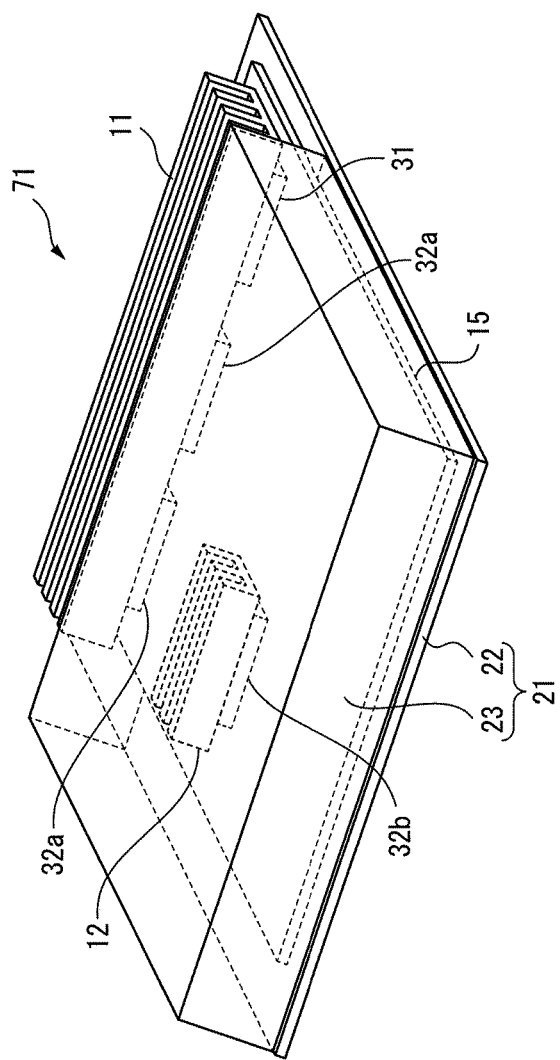
FIG. 4 is a schematic perspective view of a motor driving device of a comparative example.

FIG. 4 shows a schematic view of a motor driving device of a comparative example. In a motor driving device 71 of the comparative example, the switching element 31 for the spindle and two switching elements 32a for the feed axes are mounted on the first heat sink 11 arranged outside the housing 21. Further, the switching element 32b for the feed axis and the second heat sink 12 are arranged inside the housing 21. In the motor driving device 71 of the comparative example, the switching elements 31 and 32a arranged outside the housing 21 can be effectively cooled. However, the heat is accumulated inside the housing 21, so that the cooling capacity of the switching element 32b arranged inside the housing 21 becomes lower.

With reference to FIG. 2 and FIG. 3, in contrast, in the motor driving device 10 of the present embodiment, one switching element 31 for the spindle and two switching elements 32a for the feed axes are arranged outside the housing. Further, the first heat sink 11 for cooling the switching elements 31 and 32a is arranged outside the housing 21. The first heat sink 11 can release the heat directly to the ambient air and have high cooling capacity. Thus, the first heat sink 11 can effectively cool the switching element 31 for the spindle and two switching elements 32a for the feed axes.

In the motor driving device 10 of the present embodiment, the second heat sink 12 is thermally connected to the first heat sink 11 by the heat conduction plate 51. In the housing 21, the heat radiation performance of the second heat sink 12 becomes lower. However, the heat can be transferred from the second heat sink 12 to the first heat sink 11 by the heat conduction plate 51, and the cooling performance of the second heat sink 12 can be improved. The second heat sink 12 can cool the switching element 32b arranged inside the housing 21 with the high cooling capacity.

In addition, the heat conduction plate 51 can transfer the heat inside the housing 21 to the outside of the housing 21. Accordingly, the heat remaining inside the housing 21 can be released to the ambient air.

In the motor driving device 10 of the present embodiment, the switching element 31 for the spindle is mounted on the first heat sink 11 arranged outside the housing 21. Further, the switching element mounted on the second heat sink 12 arranged inside the housing 21 is the switching element 32b for the feed axis. Generally, the switching element 31 for the spindle most greatly generates heat among a plurality of types of the switching elements. When the motor for the spindle is continuously operated at a high output, the switching element 31 for the spindle continuously generates heat. However, the switching element 31 for the spindle is mounted on the first heat sink 11 outside the housing 21 and can be effectively cooled.

When the spindle motor 6 is driven at the high output, the feed axis motors 5 are less often driven at the high output. In contrast, when the feed axis motors 5 are driven at the high output, i.e., the feed axis motors 5 are driven at a high speed, it is often the case that the output of the spindle motor 6 is small or the spindle motor 6 is stopped.

When the switching element 32b for the feed axis within the housing 21 is greatly operated and generates heat, a heat generation amount of the switching element 31 for the spindle is small. In this case, a temperature difference between the first heat sink 11 and the second heat sink 12 is large, and the heat of the second heat sink 12 can be transferred to the first heat sink 11. Thus, the switching element 32b within the housing 21 can be effectively cooled.

When the switching element 31 for the spindle greatly generates heat, a heat generation amount of the switching element 32b for the feed axis within the housing 21 is often small. Thus, the switching element 32b within the housing 21 can be sufficiently cooled by the second heat sink 12.

As described above, the motor driving device 10 of the present embodiment can arrange the switching elements for the feed axes within the housing even when the number of the switching elements is large. Further, the switching elements arranged inside the housing can be effectively cooled.

The motor driving device 10 in the present embodiment comprises a first cooling fan 41 for generating an air flow on a surface of the first heat sink 11. The first cooling fan 41 is arranged outside the housing 21. The first cooling fan 41 is arranged to face an end part of the first heat sink 11. When the first cooling fan 41 is driven, an air flow is generated in a direction to which the fins of the first heat sink 11 extend as illustrated by an arrow 81.

The switching element 31 for the spindle of the present embodiment is connected to an end part in the longitudinal direction of the first heat sink 11. The switching element 31 for the spindle is arranged on an upstream area of the air flow in the first heat sink 11. The switching element 31 for the spindle is in contact with a low temperature air and can be effectively cooled.

The one end part of the heat conduction plate 51 of the present embodiment is sandwiched between the first heat sink 11 and the switching elements 31 and 32a, and the other end part thereof is sandwiched between the second heat sink 12 and the switching element 32b. By adopting this configuration, when the switching element 32b greatly generates heat, the heat of the switching element 32b can be quickly transferred to the first heat sink 11.

In the present embodiment, a second cooling fan 42 for cooling the second heat sink 12 is installed in the lid portion 23 of the housing 21. On the lid portion 23, a slit portion 43 is formed for taking air into the inside of the lid portion 23. The slit portion 43 is formed on an opposite side to a side on which the second cooling fan 42 is arranged. When the second cooling fan 42 is driven, an air flow is generated inside the lid portion 23, and cooling of the second heat sink 12 can be facilitated.

The number of rotations of the first cooling fan 41 and the second cooling fan 42 of the motor driving device 10 can be adjusted according to demand. In the present embodiment, the heat of the second heat sink 12 arranged inside the housing 21 can be released to the outside of the housing 21 via the heat conduction plate 51. Thus, the second cooling fan 42 may not be arranged.

The motor driving device of the present embodiment can be installed in a power magnetics cabinet of the machine tool. When the motor driving device is installed in the power magnetics cabinet, it is preferable to perform installation so that the first heat sink is arranged on the outside of a frame body of the power magnetics cabinet. In other words, it is preferable that the motor driving device is arranged so that the first heat sink is exposed to the ambient air. By adopting this configuration, the heat can be released from the first heat sink to the atmosphere via the heat conduction plate even when the second heat sink is arranged inside the frame body of the power magnetics cabinet.

Figure 5:
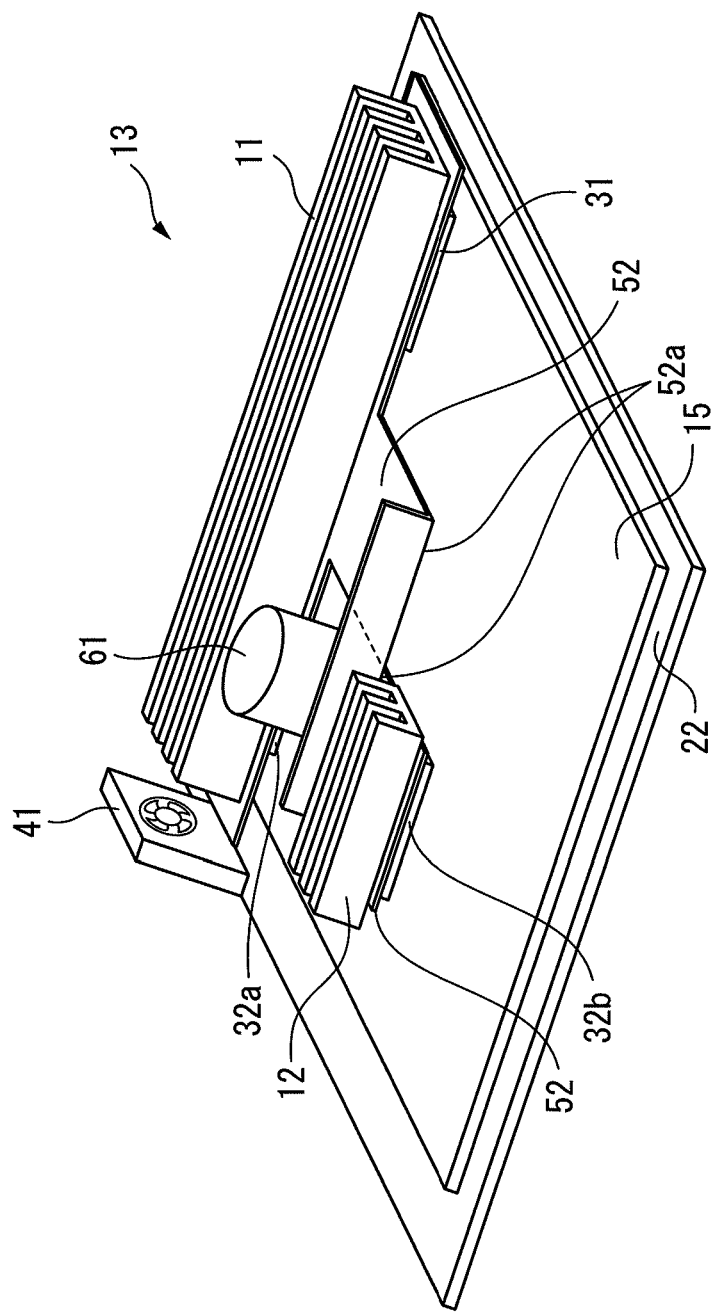
FIG. 5 is a schematic perspective view of another motor driving device in the embodiment when a lid portion is removed.

FIG. 5 shows a perspective view of another motor driving device in the embodiment when a lid portion is removed. In the housing 21, there are components such as structural components for supporting the substrate and electrical components. In the other motor driving device 13, an electrical component 61 installed on the printed circuit board 15 is arranged between the first heat sink 11 and the second heat sink 12. Another motor driving device 13 comprises the heat conduction plate 52. A part of the heat conduction plate 52 is bent so as not to interfere with the electrical component 61. The heat conduction plate 52 includes a plurality of bent portions 52a. In the present embodiment, the heat conduction plate 52 is folded at the bent portion 52a. The heat conduction plate 52 is formed to avoid the electrical component 61. When a bent part is formed in the heat conduction plate 52, the bent portion can be formed in an arbitrary shape.

As the bent portion, it is not limited to a shape in which the heat conduction plate 52 is folded, and the heat conduction plate 52 may be curved to have a curvature. Since the bent portion 52a is formed, the heat conduction plate 52 can be formed so that a surface thereof extends in a direction perpendicular to the printed circuit board 15 even when an area in which the heat conduction plate 52 is arranged is small. In addition, a cross sectional area of the heat conduction plate 52 when being cut in a surface perpendicular to a heat transfer direction can be enlarged. Accordingly, the heat generated by the switching element 32b can be sufficiently transferred to the first heat sink 11.

As a member for transferring the heat, for example, a heat pipe can be taken up. However, it is difficult to form a bent part in the heat pipe. In contrast, it is easy to form the bent portion in the heat conduction plate of the present embodiment. In addition, the bent portion can change a heat transfer path so as to avoid interference with components installed in the substrate. Further, the heat conduction plate can thermally connect the first heat sink and the second heat sink if the bent portion is included therein.

According to the present invention, the motor driving device can be provided which effectively performs heat radiation of the switching element arranged inside of the housing.

The above-described embodiments can be appropriately combined. In each of the above-described drawings, the same or the corresponding parts are denoted by the same reference numerals. The above-described embodiments are illustrative and not intended to limit the present invention.

Further, the embodiments include modifications of the embodiment described in the scope of claims.

The invention claimed is:

1. A motor driving device for driving a spindle motor and a feed axis motor of a machine tool, the motor driving device comprising:
    a switching element for a spindle configured to drive the spindle motor;
    a switching element for a feed axis configured to drive the feed axis motor;
    a housing configured to cover components installed in a substrate;
    a first heat sink arranged outside the housing;
    a second heat sink arranged inside the housing; and
    a heat conduction plate configured to thermally connect the first heat sink and the second heat sink; wherein
    the switching element for the spindle is mounted on the first heat sink, and the switching element for the feed axis is mounted on the second heat sink.

2. The motor driving device according to claim 1, wherein one end part of the heat conduction plate is sandwiched between the first heat sink and the switching element for the spindle, and the other end part of the heat conduction plate is sandwiched between the second heat sink and the switching element for the feed axis.

3. The motor driving device according to claim 1, wherein the heat conduction plate includes a bent portion which is bent to avoid components installed in the substrate.

* * * * *